United States Patent [19]

Inoue et al.

[11] Patent Number: 5,517,468

[45] Date of Patent: May 14, 1996

[54] ELECTRONIC TIMEPIECE WITH THERMOELECTRIC ELEMENT

[75] Inventors: Tatsunori Inoue; Keisuke Tsubata, both of Chiba, Japan

[73] Assignee: Seiko Instruments Inc., Japan

[21] Appl. No.: 507,042

[22] Filed: Jul. 25, 1995

[30] Foreign Application Priority Data

Jul. 29, 1994 [JP] Japan .................................. 6-178991

[51] Int. Cl.⁶ .............................. G04B 1/00; G04C 3/00; H02J 3/32
[52] U.S. Cl. .............................. 368/64; 368/203; 307/48; 307/72; 310/306; 320/2; 320/61
[58] Field of Search ...................... 368/64, 66, 203–205; 307/44–48, 71, 72; 310/306; 320/2, 61

[56] References Cited

U.S. PATENT DOCUMENTS

| | | | |
|---|---|---|---|
| 4,106,279 | 8/1978 | Martin et al. | 368/203 |
| 4,165,477 | 8/1979 | Comte | 368/205 |
| 4,213,292 | 7/1980 | Dolezal et al. | 368/204 |
| 4,320,477 | 3/1982 | Baumgartner | 368/64 |

*Primary Examiner*—Vit W. Miska
*Attorney, Agent, or Firm*—Adams & Wilks

[57] ABSTRACT

In an electric timepiece using a small and thin thermoelectric element wherein a first insulator made of silicon is on the heat absorbing side and a second insulator made of silicon is on the heat radiating side, when a temperature difference is applied thereon such that the temperature on the heat absorbing side is higher than that on the heat radiating side, heat is transferred in a direction from the insulator 101 to the insulator. In that case, electrons move toward the insulator on the heat radiating side in a n-type semiconductor. Holes move toward the insulator on the heat radiating side in a p-type semiconductor. The n-type semiconductor and the p-type semiconductor are electrically connected in series via a connector and therefore, the heat transfer is converted into current and an electromotive force can be provided between output terminals. Further, the electromotive force is stored in an electric storage means. A time display means is operated by the electromotive force from the electric storage means.

6 Claims, 12 Drawing Sheets

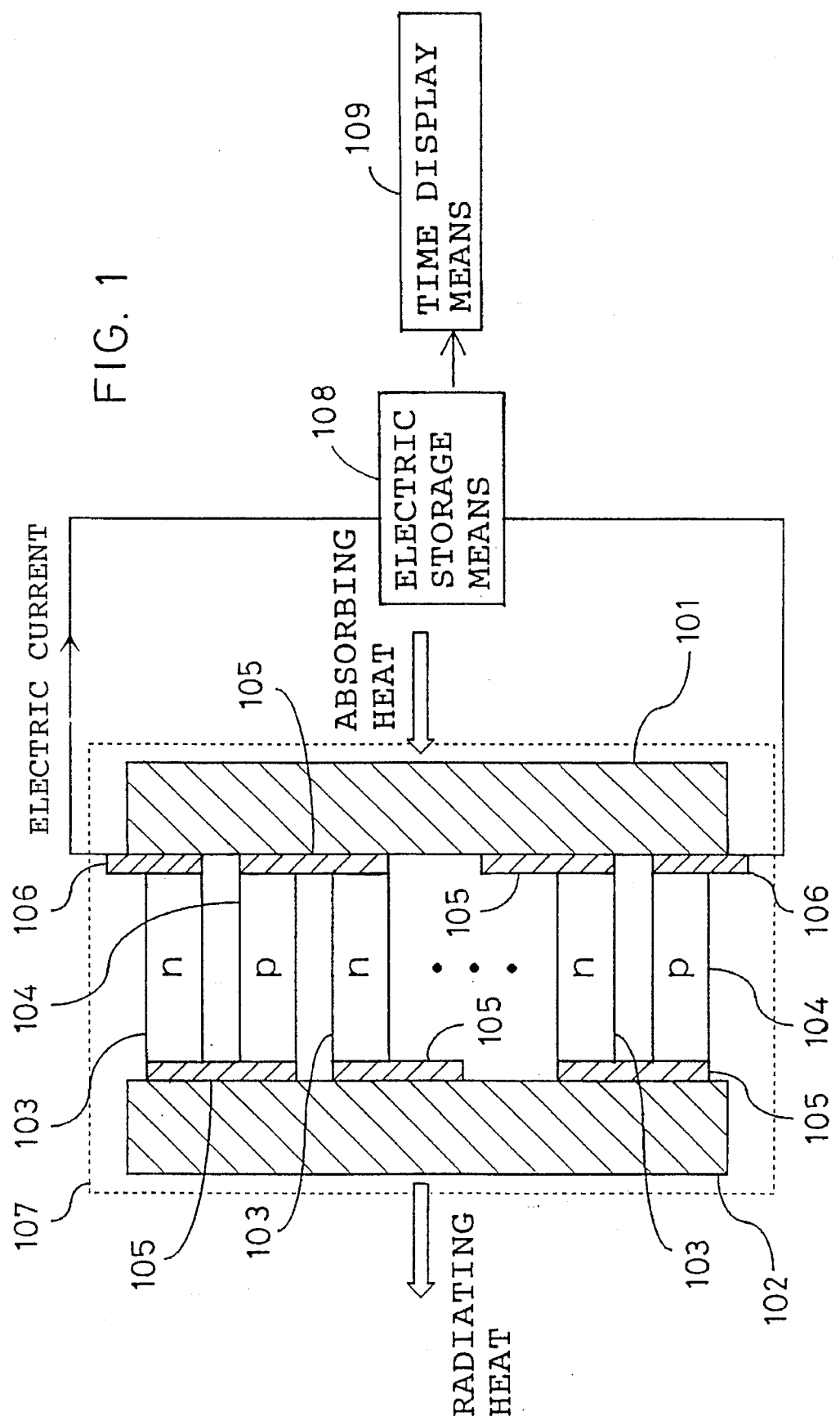

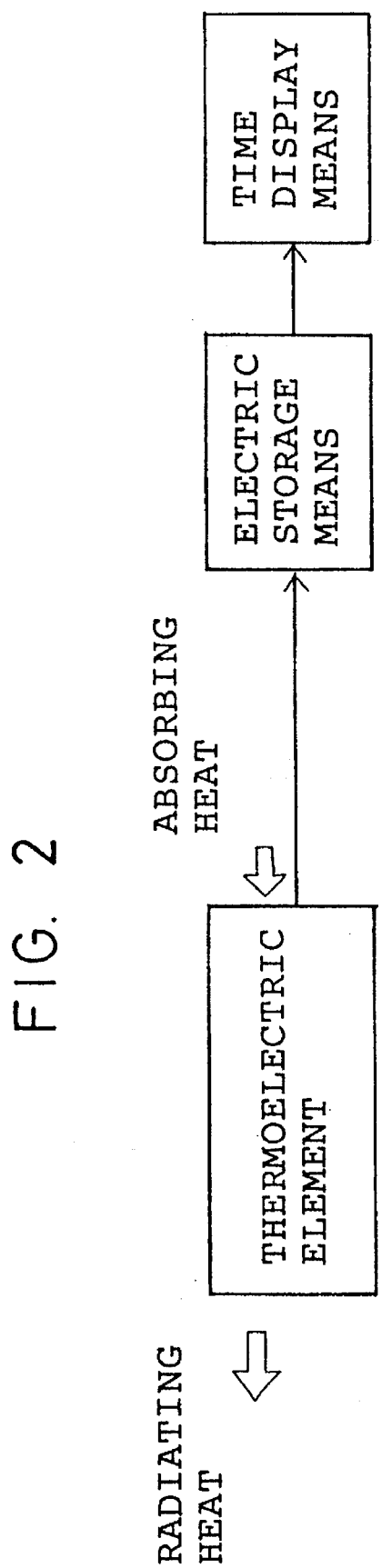

PROCESS 3001

PROCESS 3002

PROCESS 3003

PROCESS 3007

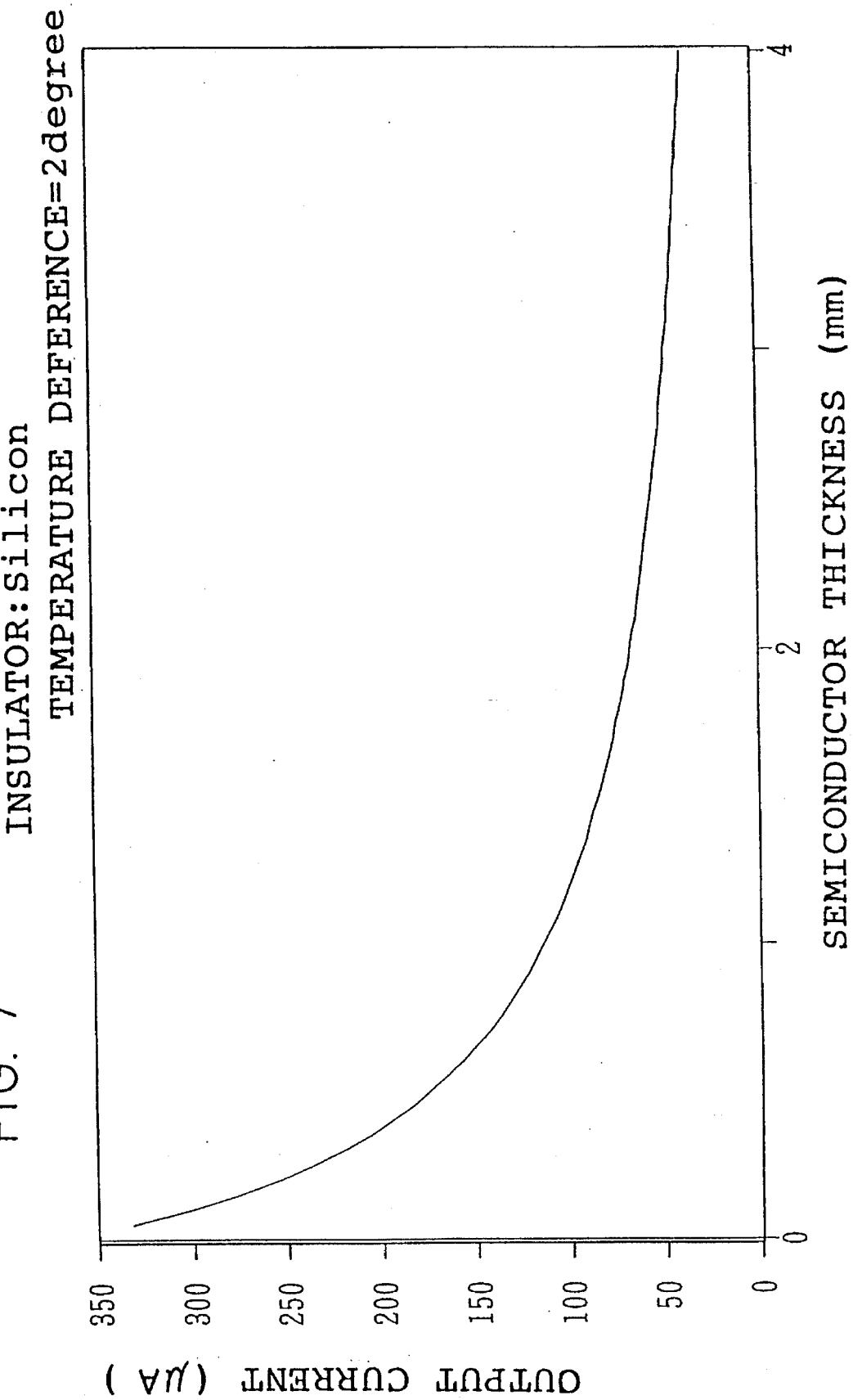

603

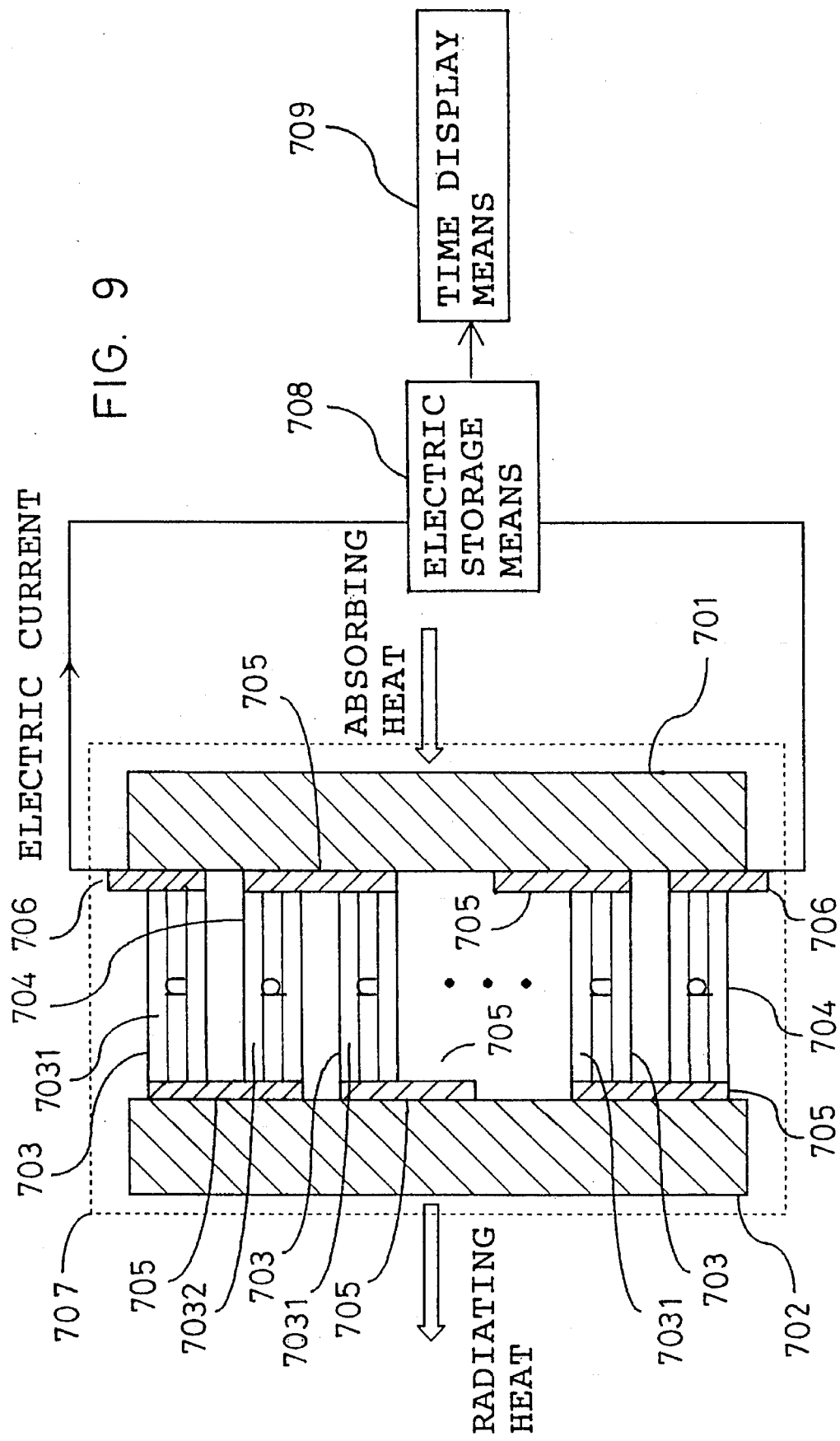

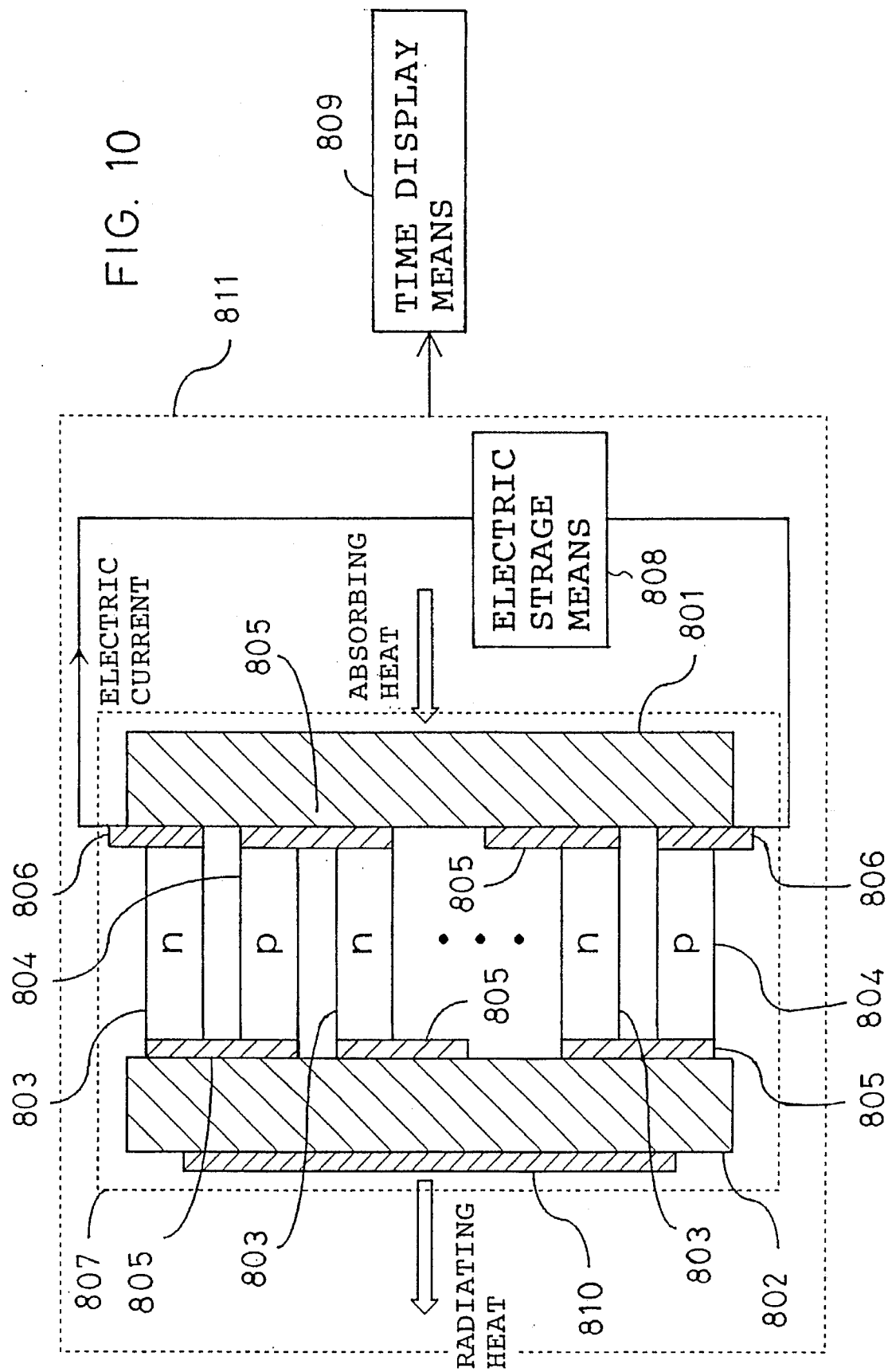

ELECTRONIC TIMEPIECE WITH THERMOELECTRIC ELEMENT

BACKGROUND OF THE INVENTION

The present invention relates to an electronic timepiece using a thermoelectric element.

An electronic timepiece having a thermoelectric element is described in, for example, Japanese Unexamined Patent Publication No. 20483/1980.

The thermoelectric element described in the publication is provided with a cold electrode and a hot electrode and utilizes Seebeck effect wherein temperatures of the cold electrode and the hot electrode are made different to thereby generate an electromotive force in the thermoelectric element. An embodiment described in the publication is shown in FIG. 12.

As illustrated in FIG. 12, a thermoelectric element 1002 is provided inside of a back plate 1003 in contact with a case of a wrist watch and a hot electrode is provided on the side of the back plate of the thermoelectric element.

In contrast thereto a cold electrode is provided on the side of a movement 1001 at the bottom face of a dial.

However, only the constitution of the thermoelectric element and the movement is described in Japanese Unexamined Patent Publication No. 20483/1980 showing the electronic piece having the thermoelectric element as illustrated in FIG. 12 and the constitution of the electronic piece having a detailed constitution of the thermoelectric element is not shown.

The generator function of a thermoelectric element is in proportion to numbers of n-type semiconductors and p-type semiconductors and the thicker the thickness of the n-type semiconductor and the p-type semiconductor, the larger the generated electromotive force and the higher the generator efficiency.

However, when this thermoelectric element is used in an electronic timepiece, it is necessary to make the volume of the thermoelectric element as small as possible and further, the promotion of the generator function is required.

SUMMARY OF THE INVENTION

It is an object of the present invention to resolve the above-mentioned problems and to provide an electronic timepiece having a thermoelectric element which is small and which is provided with generator function sufficient to operate the electronic timepiece without stopping it.

In order to achieve the above object, the present invention provides an electronic timepiece including a thermoelectric element, an electric storage means for storing an electromotive force generated by the thermoelectric element and a time display means wherein the thermoelectric element includes a plurality of connectors for connecting a plurality of n-type semiconductors and a plurality of p-type semiconductors such that respectives of the pluralities of n-type and p-type semiconductors are connected alternately and electrically in series, output terminals for outputting the electromotive force, a first insulator made of silicon to which every other ones of the connectors are fixed and a second insulator made of silicon to which connectors other than the ones fixed to the first insulator are fixed wherein the thermoelectric element is constituted by connecting 2000 or more pieces and 7500 or less pieces of the plurality of n-type semiconductors and the plurality of p-type semiconductors in series.

FIG. 1 is a view showing structure and principle of electricity generation of a thermoelectric element and principle of operation of an electronic timepiece according to the present invention. In case where a first insulator 101 made of silicon is on the heat absorbing side and a second insulator 102 made of silicon is on the heat radiating side, when a temperature difference is applied therebetween such that the temperature on the heat absorbing side is higher than that on the heat radiating side, heat is transferred in a direction from the insulator 101 to the insulator 102.

In that case, electrons move toward the insulator 102 on the heat radiating side in a n-type semiconductor 103. Holes move toward the insulator 102 on the heat radiating side in a p-type semiconductor 104.

The n-type semiconductor 103 and the p-type semiconductor 104 are electrically connected in series via a connector 105 and therefore, the heat transfer is converted into current whereby an electromotive force can be provided between output connectors 106.

The electromotive force is stored in an electric storage means 108.

A time display means is operated by the electromotive force from the electric storage means 108.

FIG. 9 is a view showing structure and principle of electricity generation of a thermoelectric element using composite devices and principle of operation of an electronic timepiece according to the present invention. In case where a first insulator 701 made of silicon is on the heat absorbing side and a second insulator 702 made of silicon is on the heat radiating side, when a temperature difference is applied therebetween such that the temperature on the heat absorbing side is higher than that on the heat radiating side, heat is transferred in a direction from the insulator 701 to the insulator 702. In that case, electrons move toward the insulator 702 on the heat radiating side in a n-type semiconductor composite device 703. Holes move toward the insulator 702 on the heat radiating side in a p-type semiconductor composite device 704. The n-type semiconductor composite device 703 and the p-type semiconductor composite element 704 are electrically connected in series via a connector 705 and therefore, the heat transfer is converted into current whereby an electromotive force can be provided between output terminals 706.

Further, the electromotive force is stored in an electric storage means 708.

A time display means 709 is operated by the electromotive force from the electric storage means 708.

FIG. 2 is a system block diagram showing principle of operation of an electronic timepiece according to the present invention. A temperature difference is applied on a thermoelectric element 201, an electromotive force is generated and the electromotive force is stored in an electric storage means 202. When the voltage of the electric storage means 202 reaches a voltage value capable of driving a time display means 203, the time display means 203 is driven.

BRIEF DESCRIPTION OF THE DRAWINGS

FIG. 1 is a view showing principle of operation of an electronic timepiece according to the present invention;

FIG. 2 is a system block diagram of an electronic timepiece according to the present invention;

FIG. 7 is a simulation result (output current value) of the thermoelectric element in the first embodiment of the present invention;

FIG. 9 is a view showing principle of operation of an electronic timepiece in a second embodiment of the present invention;

FIG. 10 is a view showing principle of operation of an electronic timepiece in a third embodiment of the present invention;

Figure 3A:
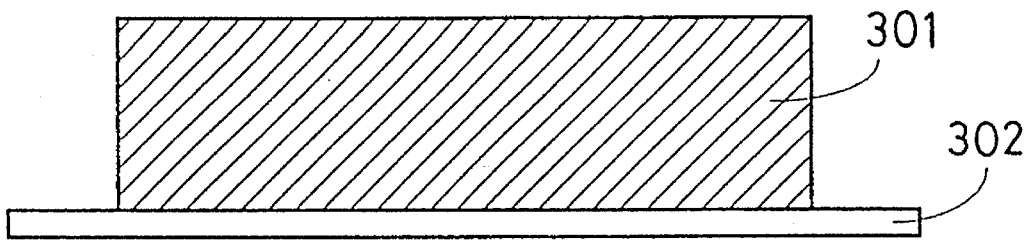
FIGS. 3A–3C are explanatory views (1) of manufacturing processs of a thermoelectric element in the first embodiment of the present invention.
Figure 3B:
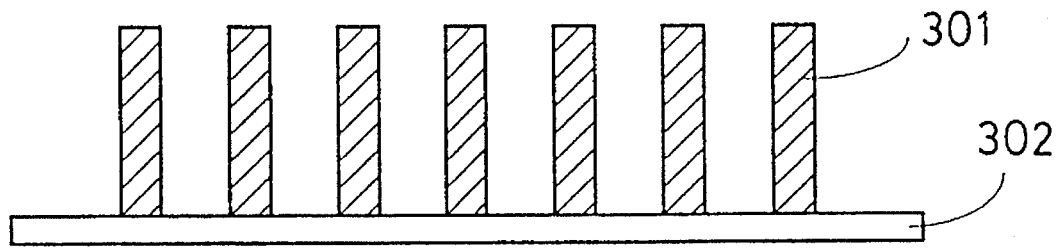
Figure 3C:
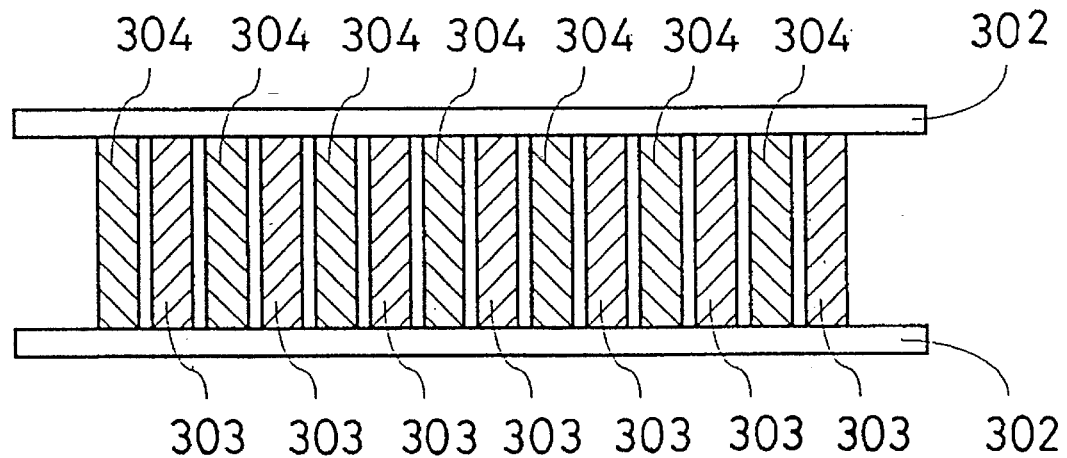
Figure 4A:
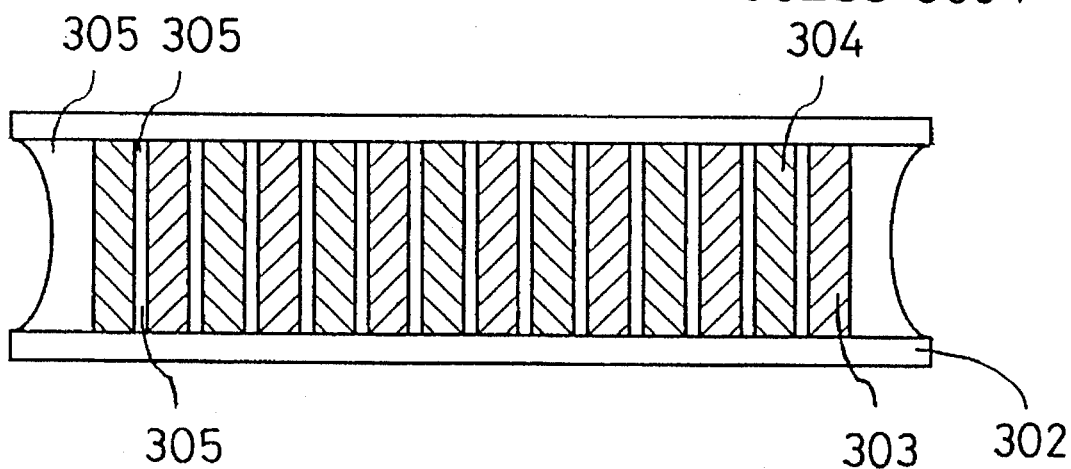
FIGS. 4A–4C are explanatory views (2) of manufacturing steps of the thermoelectric element in the first embodiment of the present invention.
Figure 4B:
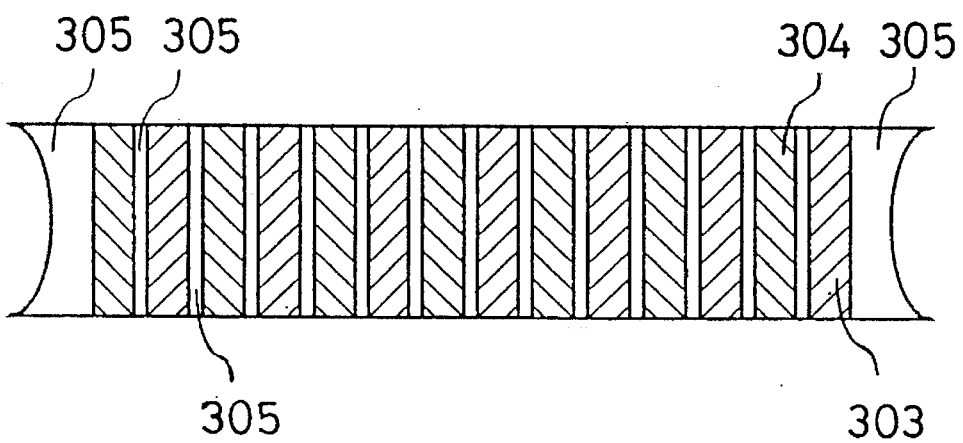
Figure 4C:
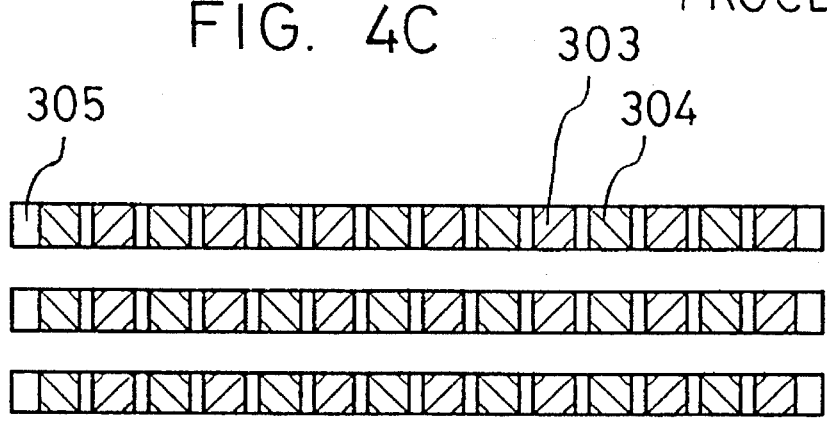

DETAILED DESCRIPTION OF THE PREFERRED EMBODIMENTS (1) First embodiment

FIG. 1 is a view showing structure and principle of electricity generation of a thermoelectric element and principle of operation of an electric timepiece provided with the thermoelectric element. The insulator 101 and the insulator 102 use silicon. In case where the insulator 101 is on the heat absorbing side and the second insulator 102 is on the heat radiating side, when a temperature difference is applied therebetween such that the temperature on the heat absorbing side is high and the temperature on the heat radiating side is low, heat is transferred in a direction from the first insulator 101 to the second insulator 102. In that case, when a bismuth-tellurium series material or a lead-tellurium series material is used in the n-type semiconductor 103 and the p-type semiconductor 104, electrons move toward the second insulator 102 on the heat radiating side in the n-type semiconductor 103 and holes move toward the second insulator 102 on the heat radiating side in the p-type semiconductor 104. The n-type semiconductor 103 and the p-type semiconductor 104 are electrically connected in series via the electrode 105 and therefore, the heat transfer is converted into current and an electromotive force is generated between the electrodes 106 at both ends.

The electromotive force generated between the electrodes 106 is stored in the electric storage means 108 and when the voltage of the electric storage means 108 reaches a voltage value capable of driving the time display means 110, the time display means 109 starts operating.

FIG. 2 is a system block diagram showing principle of operation of an electronic time piece using the thermoelectric element of the present invention as an energy source. When a temperature difference is applied in the thermoelectric element 201 and an electromotive force is generated, it is stored in the electric storage means 202. When the voltage of the electric storage means 202 reaches a size sufficient to drive the time display means 203, the time display means 203 starts operating.

FIG. 3A through FIG. 5B show explanatory views of manufacturing steps in the first embodiment of the present invention. According to the manufacturing method shown in FIGS. 3A through 5B, the thermoelectric element can be downsized and thinned and a number of elements per unit area can be increased. In case where a thermoelectric element is mounted in an electronic timepiece, it is necessary to provide many elements in a small space. An example of the manufacturing method is shown as follows.

Each of p-type and n-type plate-like or rod-like thermoelectric semiconductors 301 previously having a thickness that is equal to or more than a thickness necessary for the thermoelectric element, is cut into columns having a desired size. In that case, the thermoelectric semiconductor material 301 is made stay in a fixed state in cutting and after cutting such that they are not disintegrated. Therefore, the thermoelectric semiconductor material 301 is not completely cut or the thermoelectric semiconductor material 301 is bonded to other substrate 302 such as glass plate by wax, adhesive agent, solder or the like (process 3001, process 3002).

Next, the p-type semiconductor material 303 and the n-type semiconductor material 304 are oppsedly arranged such that ends of the columns thereof are alternately inserted into mutually opposite clearances (process 3003).

Portions or a total of the clearances among the columns of the oppsedly arranged p-type semiconductors 303 and n-type semiconductors 304 is filled with an insulative substance 305 such as resin, glass, ceramics or the like and the assembly is fixed and integrated by hardening the insulative substance or the like (process 3004).

End faces of the p-type semiconductors and the n-type semiconductors are exposed by cutting or grinding the integrated body in a direction orthogonal to the columns (process 3005, process 3006).

Figure 5A:
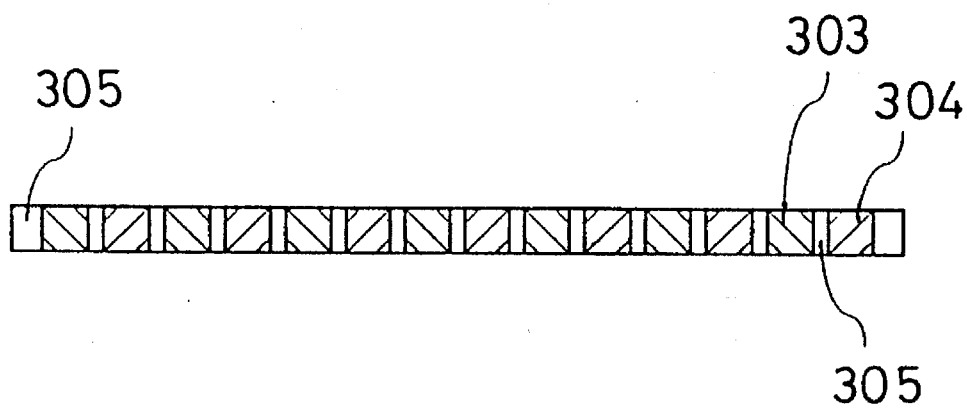
FIGS. 5A and 5B are explanatory views (3) of manufacturing steps of the thermoelectric element in the first embodiment of the present invention.
Figure 5B:
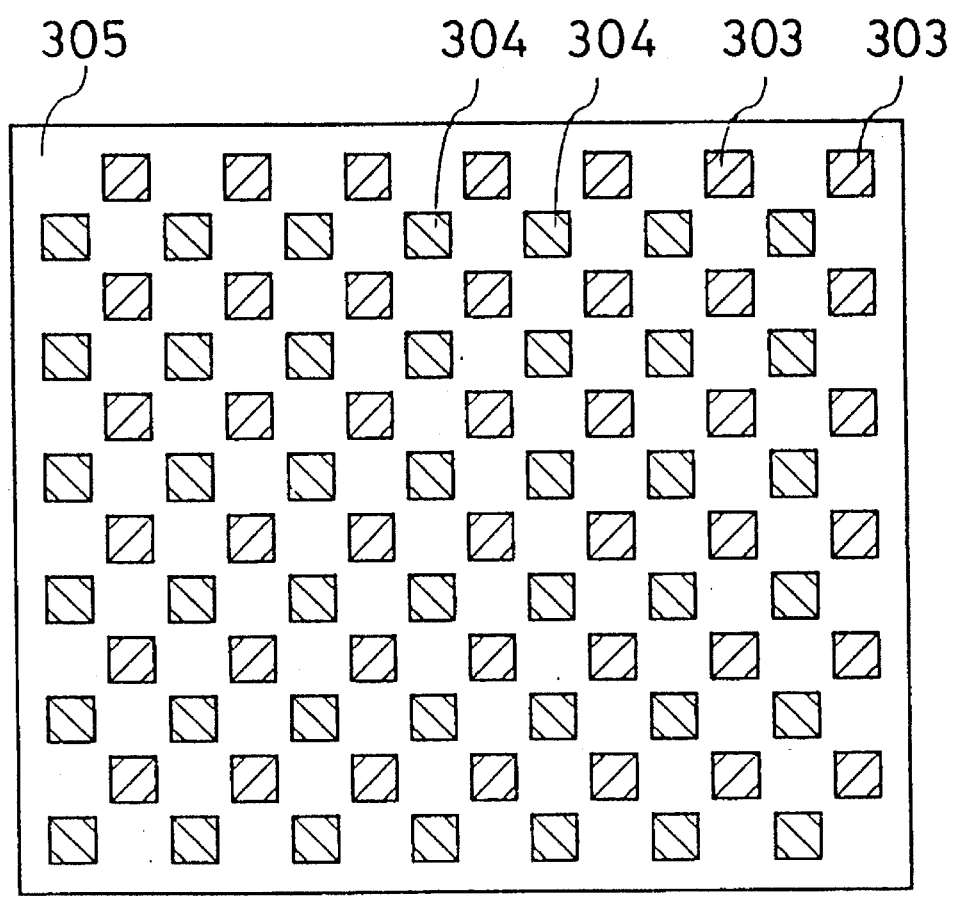

Process 3007 shown by FIGS. 5A and 5B illustrate views indicating a section and a surface of the thermoelectric element wafer. According to this method, it is possible to work the thermoelectric semiconductor material which has been cut in chips each having a size of several mm or less in a summarizingly arranged and fixed state without arranging them on a substrate. Accordingly, it is possible to manufacture a thermoelectric element having a very small size which has conventionally been difficult to make and it is possible to arrange many thermoelectric semiconductor elements in a small space as in a wrist watch whereby a high electromotive force can be generated.

Figure 6:
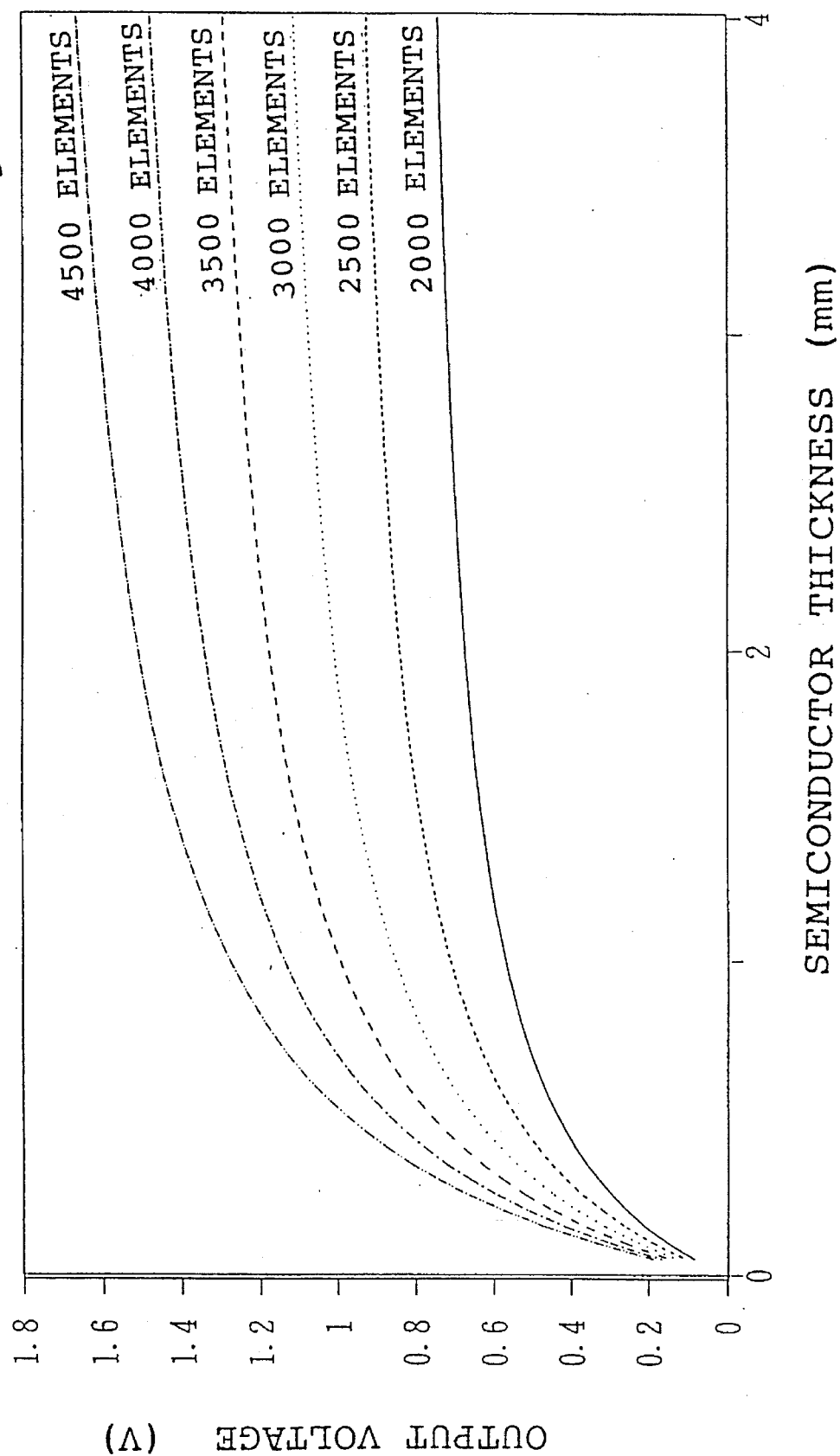
FIG. 6 shows a simulation result (output voltage value) of the thermoelectric element in the first embodiment of the present invention.

FIG. 6 illustrates graphs simulating a change of an output voltage with respect to a thickness of a thermoelectric element in case where silicon is used in respective insulators. With regard to a temperature difference applied on the thermoelectric element, the temperature difference between the heat absorbing side and the heat radiating side is set to 2° C. from an experimental result provided when a wrist watch is carried by an arm at room temperature.

A sectional area of the element is 0.01 mm$^2$ and shown is a case where a total of a number of thermoelectric elements of n-type semiconductors and p-type semiconductors is 2000 through 4500 pieces. Further, an increase in the generated output voltage value is small in a range of the thickness of 4 mm or more in FIG. 6 and therefore, the change of the output voltage from the thermoelectric element up to the thickness of 4 mm is shown.

A silver cell, or a paper cell or the like is pointed out as a cell generally used as a drive source of a carrying instrument such as a wrist watch. The size of the paper cell is generally about 0.5 mm and the thickness of the silver cell is about 1 mm through 6 mm.

Accordingly, in case where a thermoelectric element having a size equivalent to those of the drive sources is mounted in a wrist watch, it is necessary that the thickness of the thermoelectric element is about 0.5 mm or more and 6 mm or less that is the thickness equivalent to those of the conventionally used silver cell or paper cell etc. since there is restriction of the thickness of the movement, the thickness of an exterior and the like. Further, according to FIG. 6, the dispersion of the output voltage value is reduced by determining the thickness of the thermoelectric element as 1 mm or more and in most cases the silver cell is generally used as the drive source of a wrist watch. Therefore, it is more preferable to render the thickness of the thermoelectric element as 1 mm or more and 6 mm or less.

With regard to the number of thermoelectric elements, in consideration that the effective value of the operating voltage of a general IC is 0.7 V, when the thickness of the thermoelectric element is 3 mm or more, it is possible to generate the electromotive force of 0.7 V and to drive an IC of a wrist watch by determining the number of the ceramic electric elements as 2000 pieces or more. That is, in case where the thermoelectric element is used instead of the silver cell having the maximum thickness of 6 mm, the number of the thermoelectric elements may be 2000 pieces or more.

Further, in consideration of the case where the voltage of a conventional silver cell for a watch is 1.6 V in the initial state and becomes 1.5 V after starting to use it, a simulation similar to that in FIG. 6 reveals that in case where the thickness of the thermoelectric elements is approximately 0.5 mm that is equivalent to the thickness of the paper cell, it is necessary to connect approximately 7500 pieces of the thermoelectric elements when the output voltage is required to be 1.6 V.

Accordingly, in case where the thermoelectric elements are used as the drive source of an electronic timepiece, it is preferable that the number of the thermoelectric elements is 2000 pieces or more and 7500 pieces or less.

Further, in case where the thermoelectric elements are considered to be a substitute for the silver cell that is generally used as the drive source of a wrist watch, since the thickness of the silver cell is approximately 1 mm through 6 mm, a similar simulation reveals that the output voltage of 0.7 V through 1.5 V of the thermoelectric elements can be achieved when the number of the thermoelectric elements is 2000 pieces or more and 5500 pieces or less.

Here, the reduction in area necessary for arranging the thermoelectric elements, the reduction in manufacturing steps, the reduction in cost and the like can be achieved by rendering the number of the thermoelectric elements a minimum number capable of achieving the necessary output voltage value.

FIG. 7 shows an example of a simulation calculating a change in an output current value when silicon is used in the insulators. The change of the output current is calculated by the simulation of a theoretical calculation with conditions of the simulation wherein the difference between the temperatures of the insulator on the heat absorbing side and that on the heat radiating side is 2° C. and the number of elements is 4000 pieces in a total of the n-type elements and the p-type elements.

It is known from FIG. 7 that when the thickness of the elements is 0.2 mm, the output current is 0.3 mA and a current capable of charging a secondary cell or the like can be generated. Therefore, 0.2 mm or more and 6 mm or less is preferable as a range of the thickness of the thermoelectric elements used in the electronic time piece.

Figure 8A:
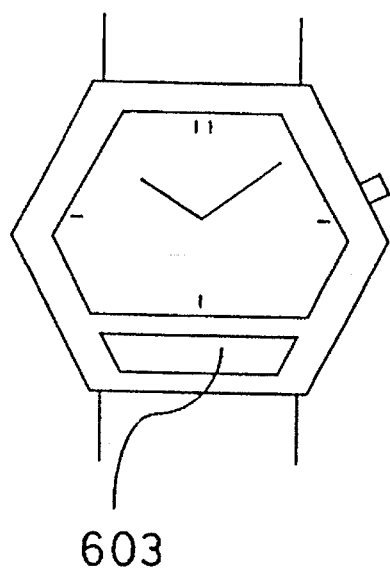
FIGS. 8A and 8B illustrate an outlook view and a sectional view showing the electronic wrist watch in the first embodiment of the present invention.
Figure 8B:
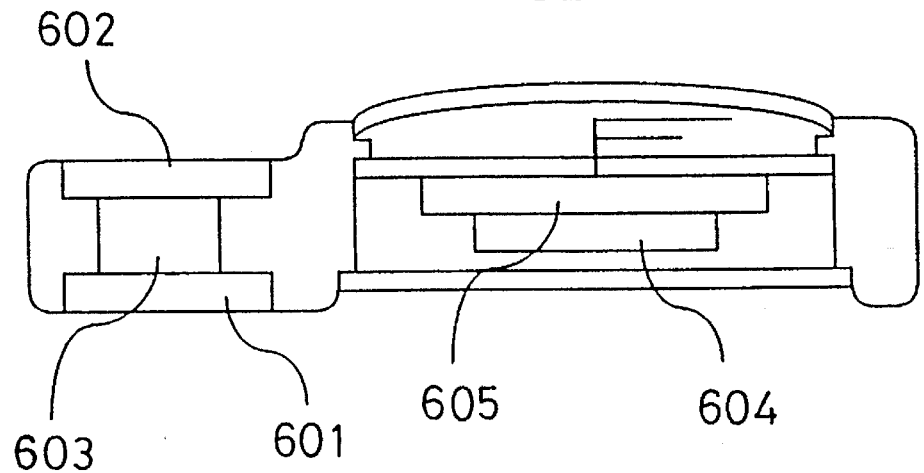

FIGS. 8A and 8B are views showing an outlook and a sectional view showing the structure of an electronic wrist watch using the thermoelectric element of the present invention as the energy source. An insulating plate 601 is on the heat absorbing side since it touches an arm of which temperature is generally higher than an atmospheric temperature and an insulating plate 602 is on the heat radiating side since it faces the atmosphere. When the insulating plate 601 absorbs heat of a human body and a temperature difference is caused between it and the insulating plate 602, the heat is transferred from the insulating plate 601 to the insulating plate 602 via an element 603 and is radiated in the atmosphere. At this instance, an electromotive force is generated by Seebeck effect which is stored in an electric storage means 604, for example, a lithium secondary cell or a vanadium-lithium secondary cell and a movement 605 is driven by the stored electricity.

Further, in case where the sectional area of n-type semiconductors and p-type semiconductors is 0.01 mm$^2$, the thickness of the element is 1 mm, a total number of the elements including the n-type ones and the p-type ones is 4000 pieces, the distance between the n-type semiconductor and the p-type semiconductor is 0.2 mm and the thicknesses of the electrodes on the heat radiating side and on the heat absorbing side and the insulating plates are respectively 1 mm, the total size of the thermoelectric elements is approximately 14 mm×14 mm×3 mm. Accordingly, it is possible to mount the thermoelectric element in a wrist watch along with the movement and the secondary cell and an approximately 1.2 V of an electromotive force can be provided when the temperature difference of 2° C. is applied on the thermoelectric element.

(2) Second embodiment

FIG. 9 is a view showing structure and principle of a thermoelectric element and principle of operation of an electronic timepiece provided with the thermoelectric elements in a second embodiment of the present invention. The insulator 701 and the insulator 702 use silicon. In case where the insulator 701 is on the heat absorbing side and the second insulator 702 is on the heat radiating side, when a temperature difference is applied therebetween such that the temperature of the heat absorbing side is higher than that on the heat radiating side, heat is transferred in a direction from the first insulator 701 to the second insulator 702. In that case, when the n-type semiconductor composite device 703 and the p-type semiconductor composite device 704 use a bismuth-tellurium series material or a lead-tellurium series material, electrons move toward the second insulator 702 on the heat radiating side in the n-type semiconductor composite device 703 and holes move toward the second insulator 702 on the heat radiating side in the p-type semiconductor composite device 704. The n-type semiconductor composite device 703 and the p-type semiconductor composite device 704 are electrically connected in series via the electrode 705 and therefore, the heat transfer is converted into current and an electromotive force is caused between the electrodes 706 at both ends.

The reduction in the manufacturing cost, the promotion in the yield and the promotion in the reliability can be achieved by constituting the thermoelectric element 707 by using the semiconductor composite devices in such a manner.

Further, as in the first embodiment, the electromotive force generated between the electrodes 706 is stored in electric storage means 708 and when the voltage of the electric storage means 708 reaches a voltage capable of driving the time display means 709, the time display means 709 starts operating.

(3) Third embodiment

FIG. 10 is a view showing structure of a thermoelectric element and structure of an electronic timepiece provided with the thermoelectric element in a third embodiment of the present invention. An insulator 801 and an insulator 802 use silicon and an IC chip 810 of a IC, LSI or the like is provided on the insulator 802 to operate component elements of the electronic timepiece. By such a structure of a thermoelectric element 807, a space necessary for mounting the IC 810 for driving a wrist watch or the like can be shared by the thermoelectric element 807. Accordingly, it is a very effective way in case where it is necessary to constitute many elements in a small space as in a wrist watch.

Further, although the IC chip 810 is provided on the insulator 802 made of silicon, it is possible to constitute simultaneously more IC chips in a small space by simultaneously providing the IC chips also on the insulator 801.

An electromotive force generated between electrodes 806 is stored in an electric storage means 808 and when the voltage of the electric storage means 808 reaches a constant voltage value, the IC chip 810 such as a IC, a LSI or the like and a time display means 809 start operating.

(4) Fourth embodiment

Figure 11:
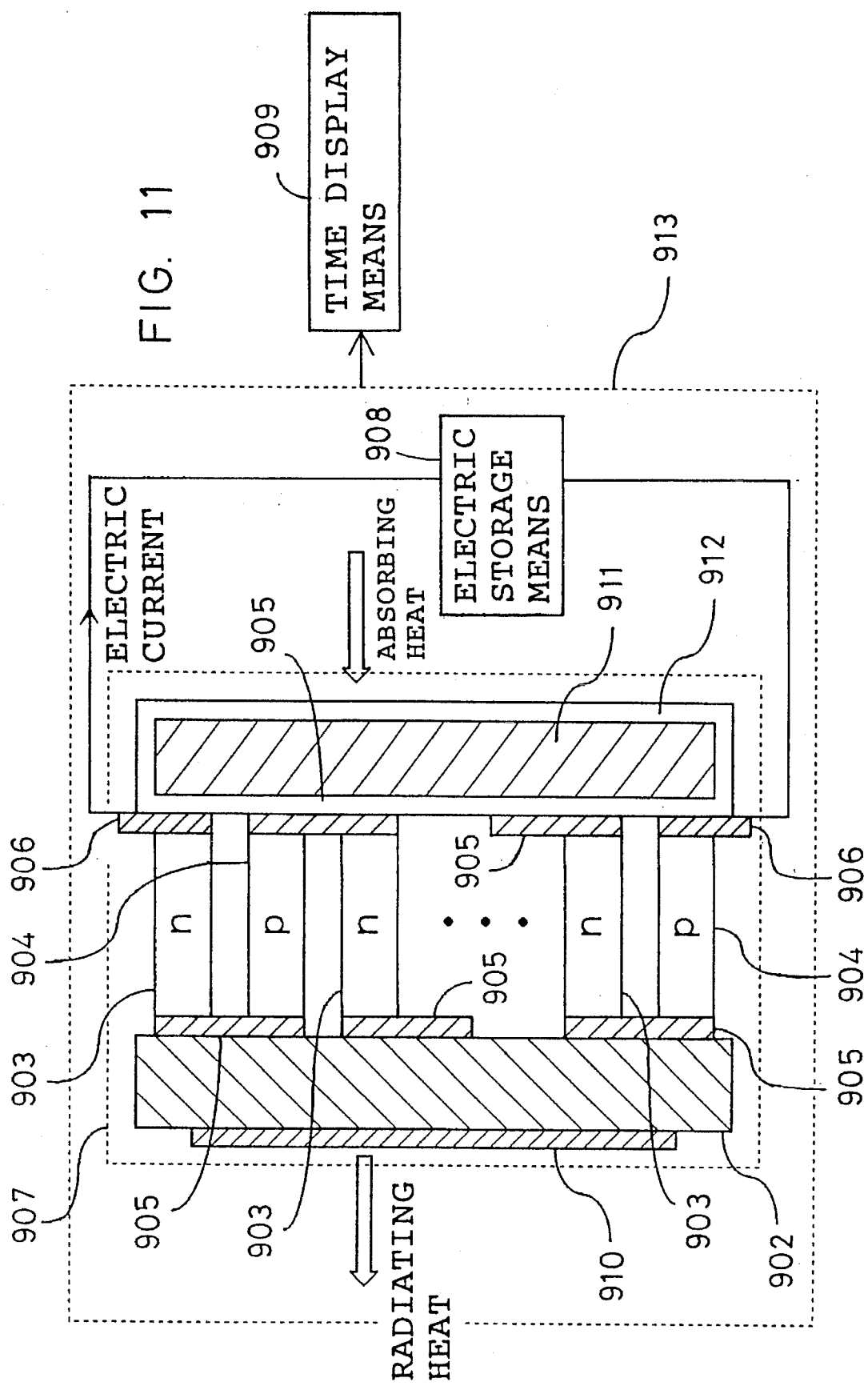
FIG. 11 is a view showing principle of operation of an electronic timepiece in a fourth embodiment of the present invention.
Figure 12:
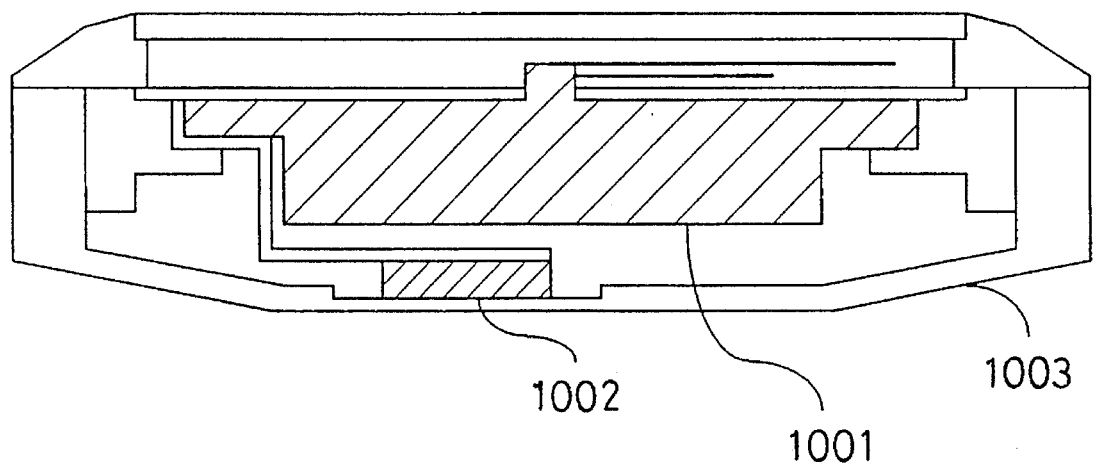
FIG. 12 is a sectional view showing a wrist watch in a conventional examples.

FIG. 11 is a view showing structure of a thermoelectric element and structure of an electronic timepiece provided with the thermoelectric element in a fourth embodiment of the present invention. An insulator 902 on the heat radiating side uses silicon and at the same time an IC chip 910 such as a IC, LSI or the like is provided thereto to operate component elements of the electronic timepiece.

Further, an insulator 901 on the heat absorbing side is composed of aluminum 911 to which an oxide layer 912 is attached. The heat conductivity of the aluminum 911 attached with the oxide layer 912 is higher than that of silicon. Therefore, in considering a thermoelectric element 907, it is possible to reduce a number and a thickness of necessary semiconductor elements in comparison with a case where the insulators on the heat absorbing side and on the heat radiating side are made of silicon and also the generator efficiency can be promoted.

Further, a space necessary for mounting an IC 910 for driving a wrist watch etc. can be shared by the thermoelectric element 907. Therefore, it is possible to constitute many elements in a small space as in a wrist watch.

Accordingly, it is a very effective way for the promotion of the generator efficiency and a decrease in the space to constitute such a thermoelectric element 907.

An electromotive force generated between electrodes 906 is stored in an electric storage means 908 and when the voltage of the electric storage means 908 reaches a constant voltage value, the IC chip 910 such as a IC, a LSI or the like and a time display means 909 start operating.

According to the present invention, the thickness of n-type and p-type semiconductors of a thermoelectric element wherein silicon is used for insulators, is 0.5 mm or more and 6 mm or less whereby the thermoelectric element of which generator efficiency is improved and of which size is decreased can be provided to obtain a necessary electromotive force and an electronic time piece driven by a small and thin thermoelectric element as an energy source can be realized by using the thermoelectric element in the electronic piece.

What is claimed is:

1. An electronic timepiece with thermoelectric element comprising:

a plurality of n-type semiconductors;

a plurality of p-type semiconductors;

a plurality of connectors for connecting the plurality of n-type semiconductors and the plurality of p-type semiconductors such that respectives of the plurality of n-type semiconductors and respectives of the plurality of p-type semiconductors are connected alternately and electrically in series;

a plurality of output terminals for outputting an electromotive force from ends of the connected pluralities of n-type semiconductors and p-type semiconductors;

a first insulator to which every other ones of the plurality of connectors are fixed;

a second insulator to which respectives of the plurality of connectors other than the ones fixed to the first insulator are fixed;

a thermoelectric element having 2000 or more pieces and 7500 or less pieces of the plurality of n-type semiconductors and the plurality of p-type semiconductors connected in series;

an electric storage means for storing the electromotive force generated by the thermoelectric element; and a time display means operated by the electromotive force stored in the electric storage means.

2. An electronic timepiece with thermoelectric element according to claim 1, wherein the plurality of n-type semiconductors and the plurality of p-type semiconductors respectively comprise n-type semiconductor composite devices and p-type semiconductor composite devices.

3. An electronic timepiece with a thermoelectric element according to claim 1, wherein a thickness of the plurality of n-type semiconductors and the plurality of p-type semiconductors fixed between the first insulator and the second insulator is 0.2 mm or more and 6 mm or less.

4. An electronic timepiece with a thermoelectric element according to claim 1, wherein at least one of the first insulator and the second insulator is made of silicon.

5. An electronic timepiece with a thermoelectric element according to claim 1, wherein at least one of the first insulator and the second insulator is formed by aluminum covered with an oxide film.

6. An electronic timepiece with a thermoelectric element according to claim 1, wherein an IC chip is provided on at least one of the first insulator and the second insulator.

* * * * *